United States Patent
Kurita et al.

(10) Patent No.: US 10,543,569 B2
(45) Date of Patent: Jan. 28, 2020

(54) BONDING MATERIAL AND BONDING METHOD USING SAME

(71) Applicant: Dowa Electronics Materials Co., Ltd., Tokyo (JP)

(72) Inventors: Satoru Kurita, Okayama (JP); Takashi Hinotsu, Okayama (JP); Keiichi Endoh, Okayama (JP); Hiromasa Miyoshi, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 15/318,500

(22) PCT Filed: May 29, 2015

(86) PCT No.: PCT/JP2015/066271
§ 371 (c)(1),
(2) Date: Dec. 13, 2016

(87) PCT Pub. No.: WO2015/198832
PCT Pub. Date: Dec. 30, 2015

(65) Prior Publication Data
US 2017/0120395 A1    May 4, 2017

(30) Foreign Application Priority Data

Jun. 25, 2014  (JP) ................. 2014-130311

(51) Int. Cl.
*B23K 35/00* (2006.01)
*B23K 1/00* (2006.01)
*B23K 35/30* (2006.01)
*B23K 35/02* (2006.01)
*B23K 35/36* (2006.01)
*H01L 23/00* (2006.01)

(52) U.S. Cl.
CPC ........ *B23K 35/3006* (2013.01); *B23K 1/0016* (2013.01); *B23K 35/025* (2013.01); *B23K 35/3612* (2013.01); *H01L 24/29* (2013.01); *H01L 24/83* (2013.01); *H01L 2224/2949* (2013.01); *H01L 2224/29294* (2013.01); *H01L 2224/29339* (2013.01); *H01L 2224/8384* (2013.01); *H01L 2924/10253* (2013.01); *H01L 2924/15747* (2013.01)

(58) Field of Classification Search
CPC ................... B23K 35/025; B23K 35/3006
See application file for complete search history.

(56) References Cited

U.S. PATENT DOCUMENTS

| | | | | |
|---|---|---|---|---|
| 5,919,317 A | * | 7/1999 | Tanahashi | B23K 35/3612 148/22 |
| 2008/0115861 A1 | * | 5/2008 | Ishiga | B23K 35/262 148/23 |
| 2011/0069121 A1 | * | 3/2011 | Park | B41J 2/14129 347/47 |
| 2013/0209692 A1 | * | 8/2013 | Zinn | H01B 1/22 427/376.6 |
| 2013/0266795 A1 | | 10/2013 | Asada et al. | |
| 2014/0113109 A1 | * | 4/2014 | Kurita | C22C 5/06 428/148 |

FOREIGN PATENT DOCUMENTS

| | | | |
|---|---|---|---|
| EP | 2719486 A1 | 4/2014 | |
| JP | 2011080147 A | 4/2011 | |
| JP | WO 2012169076 A1 * | 12/2012 | ............... C22C 5/06 |
| JP | 2014091730 A | 5/2014 | |
| WO | 2012081255 A1 | 6/2012 | |
| WO | 2012169076 A1 | 2/2015 | |

OTHER PUBLICATIONS

International search report for application No. PCT/JP2015/066271 dated Aug. 20, 2015.
IPRP for International Apln. No. PCT/JP2015/066271 dated Dec. 27, 2016.
Supplementary European search report for patent application No. 15 81 1202.9 dated Nov. 27, 2017.

* cited by examiner

*Primary Examiner* — Erin B Saad
(74) *Attorney, Agent, or Firm* — Bachman & LaPointe, PC

(57) ABSTRACT

A bonding material of a silver paste contains: fine silver particles having an average primary particle diameter of 1 to 200 nm, each of the fine silver particles being coated with an organic compound having a carbon number of not greater than 8, such as sorbic acid; and a solvent mixed with the fine silver particles, wherein a diol, such as an octanediol, is used as the solvent and wherein a triol having a boiling point of 200 to 300° C., a viscosity of 2,000 to 10,000 mPa·s at 20° C. and at least one methyl group, such as 3-methylbutane-1,2,3-triol or 2-methylbutane-1,2,4-triol, is mixed with the solvent as an addition agent.

20 Claims, No Drawings

BONDING MATERIAL AND BONDING METHOD USING SAME

TECHNICAL FIELD

The present invention relates generally to a bonding material and a bonding method using the same. More specifically, the invention relates to a bonding material of a silver paste containing fine silver particles, and a method for bonding an electronic part, such as an Si chip, on a metal substrate, such as a copper substrate, using the bonding material.

BACKGROUND ART

In recent years, it is proposed that a silver paste containing fine silver particles is used as a bonding material to be arranged between articles to be heated for a predetermined period of time while applying pressure between the articles, to sinter silver in the bonding material to bond the articles to each other (see, e.g., Japanese Patent Laid-Open No. 2011-80147).

When such a bonding material is used for fixing an electronic part, such as an Si chip, on a metal substrate, such as a copper substrate, after a silver paste containing fine silver particles dispersed in a solvent is applied on the substrate, the silver paste is heated to remove the solvent to form a predried film on the substrate to arrange the electronic part thereon, and then, the predried film is heated while applying pressure on the electronic part, so that it is possible to bond the electronic part to the substrate via a silver bonding layer.

However, in the method disclosed in Japanese Patent Laid-Open No. 2011-80147, the leveling of the surface of the predried film is not always good due to the dispersion failure, print failure and so forth of the silver paste. Therefore, in order to satisfactorily bond the electronic part to the substrate, it is required to cause the surface of the predried film to be flat by increasing pressure applied to the electronic part. For that reason, when a large and thin electronic part, such as a recent Si chip, is bonded to a substrate, there is some possibility that the surface of the electronic part may be warped or broken by increasing a load applied during the bonding of the electronic part to the substrate.

In order to eliminate such problems, there is proposed a method for forming a flat coating film by adding a viscosity modifier of a structure having an ether bond, such as 2-butoxyethoxyacetic acid or 2-methoxyethoxyacetic acid, to a silver paste containing fine silver particles (see, e.g., WO2012/169076).

However, in the method disclosed in WO2012/169076, the viscosity modifier of 2-butoxyethoxyacetic acid, 2-methoxyethoxyacetic acid or the like is added to the silver paste containing fine silver particles as a dispersant to form the flat coating film. For that reason, when an electronic part is bonded to a copper substrate by the silver paste, the dispersant reacts with the surface of the copper substrate to produce mottled protrusions of aggregates on the surface of the copper substrate to form cracks in the predried film, so that the cracked portions exist as cavities (voids) to easily deteriorate the bonding strength of the electronic part to the copper substrate. In particular, it is desired to increase the thickness of the predried film in order to obtain the stress relaxation thereof. However, if the thickness of the predried film is increased, the solvent in the predried film is evaporated at a stroke during the formation of the predried film to shrink the predried film, so that cracks are easily formed in the predried film.

DISCLOSURE OF THE INVENTION

It is therefore an object of the present invention to eliminate the aforementioned problems and to provide a bonding material, which can prevent the formation of cracks in a predried film to prevent the deterioration of the bonding strength thereof even if the thickness of the predried film is increased, and a bonding method using the same.

In order to accomplish the aforementioned and other objects, the inventors have diligently studied and found that it is possible to provide a bonding material, which can prevent the formation of cracks in a predried film to prevent the deterioration of the bonding strength thereof even if the thickness of the predried film is increased, and a bonding method using the same, if a bonding material of a silver paste comprises: a solvent which is a diol; fine silver particles mixed with the solvent; and an addition agent which is a triol having at least one methyl group, the addition agent being mixed with the solvent. Thus, the inventors have made the present invention.

According to the present invention, there is provided a bonding material of a silver paste comprising: a solvent which is a diol; fine silver particles mixed with the solvent; and an addition agent which is a triol having at least one methyl group, the addition agent being mixed with the solvent.

In this bonding material, the addition agent preferably has a boiling point of 200 to 300° C. and a viscosity of 2,000 to 10,000 mPas at 20° C. The addition agent is preferably 3-methylbutane-1,2,3-triol or 2-methylbutane-1,2,4-triol, and the solvent is preferably an octanediol. The amount of the addition agent is preferably 0.1 to 10% by weight with respect to the silver paste, and the amount of the solvent is preferably 5 to 25% by weight with respect to the silver paste. The silver paste may contain a dispersant. In this case, the dispersant is preferably 2-butoxyethoxyacetic acid, and the amount of the dispersant is preferably 1.0% by weight or less with respect to the silver paste. The fine silver particles preferably have an average primary particle diameter of 1 to 200 nm, and each of the fine silver particles is preferably coated with an organic compound having a carbon number of not greater than 8. In this case, the organic compound is preferably sorbic acid.

According to the present invention, there is provided a bonding method comprising the steps of: arranging the above-described bonding material between articles; and heating the bonding material to sinter silver therein to form a silver bonding layer to bond the articles to each other with the silver bonding layer.

Throughout the specification, the expression "the average primary particle diameter of fine silver particles" means an average value of primary particle diameters of fine silver particles based on a scanning electron microscope (SEM) or a transmission electron microphotograph (TEM image).

According to the present invention, it is possible to provide a bonding material, which can prevent the formation of cracks in a predried film to prevent the deterioration of the bonding strength thereof even if the thickness of the predried film is increased, and a bonding method using the same.

BEST MODE FOR CARRYING OUT THE INVENTION

In a preferred embodiment of a bonding material according to the present, the bonding material comprises a silver paste containing: a solvent which is a diol; fine silver particles mixed with the solvent; and an addition agent which is a triol having at least one methyl group, the addition agent being mixed with the solvent. If the addition agent having a structure similar to that of the solvent is thus mixed with the solvent, it is possible to prevent the dispersibility of the bonding material from being deteriorated even if no dispersant is added thereto.

The boiling point of the solvent is preferably 200 to 300° C., and more preferably 210 to 290° C. As such a solvent, there is preferably used an octanediol (ODO) such as 2-ethyl-1,3,hexanediol (boiling point=244.2° C., viscosity=271 mPa at 20° C.), 3-methyl-1,3-butanediol (boiling point 203° C., viscosity=250 mPa at 20° C.) or the like. The amount of the solvent is preferably 5 to 25% by weight and more preferably 5 to 20% by weight, with respect to the silver paste.

The boiling point of the addition agent is preferably 200 to 300° C., more preferably 210 to 290° C. and most preferably 220 to 285° C. If the boiling point of the addition agent is too low and a temperature at which all of the addition agent volatilizes at the same time the solvent volatilizes, it is not possible to prevent cracks from being produced in a predried film when the thickness of the predried film is increased. The viscosity (at 20° C.) of the addition agent is preferably 2,000 to 10,000 mPa·s, more preferably 4,000 to 10,000 mPa·s and most preferably 5,000 to 10,000 mPa·s. If the viscosity of the addition agent is high to some extent, there is an effect on the decrease of shrinkage of a predried film during the formation of the predried film. As such an addition agent, there is preferably used 3 methylbutane-1,2,3-triol (IPTL-A) (boiling point=255.5° C., viscosity=9,155 mPa·s (at 20° C.)), 2-methylbutane-1,2,4-triol (IPTL-B) (boiling point=278-282° C., viscosity=5,500 mPa·s (at 20° C.)) or the like. The amount of the addition agent is preferably 0.1 to 10% by weight, more preferably 0.2 to 7% by weight and most preferably 0.5 to 5% by weight, with respect to the silver paste.

The silver paste may contain a dispersant. In this case, the dispersant is preferably 2-butoxyethoxyacetic acid. The amount of the dispersant is preferably 1.5% by weight or less and more preferably 0.2 to 1.0% by weight, with respect to the silver paste.

The fine silver particles preferably have an average primary particle diameter of 1 to 200 nm, and more preferably have an average primary particle diameter of 1 to 100 nm. The amount of the fine silver particles is preferably 70 to 95% by weight and more preferably 75 to 93% by weight, with respect to the silver paste. Each of the fine silver particles is preferably coated with an organic compound having a carbon number of not greater than 8, such as hexanoic acid or sorbic acid, and more preferably coated with sorbic acid.

The bonding material preferably has a viscosity of not greater than 100 Pa·s when the viscosity is measured at 25° C., and 5 rpm (1.57 s$^{-1}$) by means of a rheometer.

In a preferred embodiment of a bonding method according to the present invention, the above-described bonding material is arranged between articles to be heated to sinter silver therein to form a silver bonding layer to bond the articles to each other with the silver bonding layer. For example, the above-described bonding material is applied on a copper substrate to arrange an electronic part thereon to be heated while applying pressure on the electronic part. Thus, silver in the silver paste is sintered to form a silver bonding layer to bond the electronic part to the copper substrate via the silver bonding layer.

Furthermore, the average primary particle diameter of the fine silver particles can be calculated, for example, from the average primary particle diameter of optionally selected 100 or more of fine silver particles on an image (SEM image or TEM image) obtained by observing the fine silver particles by means of a scanning electron microscope (SEM) (S-4700 produced by Hitachi Hi-Technologies Corporation) or a transmission electron microscope (TEM) (JEM-1011 produced by Japan Electron Optics Laboratory Ltd.) at a predetermined magnification (for example, a magnification of 180,000 by TEM when the particle diameter is not greater than 20 nm, a magnification of 80,000 by SEM when the particle diameter is greater than 20 nm and not greater than 30 nm, a magnification of 50,000 by SEM when the particle diameter is greater than 30 nm and not greater than 100 nm, and a magnification of 30,000 by SEM when the particle diameter is greater than 100 nm and not greater than 300 nm). The calculation of the average primary particle diameter of the fine silver particles can be carried out, for example, by an image analysis software (A-image-kun (registered trademark) produced by Asahi Kasei Engineering Corporation).

Examples of a bonding material and a bonding method using the same according to the present invention will be described below in detail.

Example 1

First, 72.1 g of pure water was put in a 500 mL beaker, and 13.4 g of silver nitrate (produced by Toyo Kagaku Inc.) was added thereto to be dissolved to prepare an aqueous silver nitrate solution as a raw material solution.

Then, 1.4 L of pure water was put in a 5 L beaker, and the temperature thereof was raised to 40° C. while removing dissolved oxygen by blowing nitrogen gas into the pure water for 30 minutes. To this pure water, 17.9 g of sorbic acid (produced by Wako Pure Chemical Industries, Ltd.) was added as an organic compound (for coating of fine silver particles), and thereafter, 2.8 g of 28% ammonia water (produced by Wako Pure Chemical Industries, Ltd.) was added thereto as a stabilizing agent.

While the aqueous solution was stirred after the ammonia water was added, 6.0 g of hydrous hydrazine having a purity of 80% (produced by Otsuka Chemical Co., Ltd.) was added thereto as a reducing agent after 5 minutes from the addition of the ammonia water (reaction initiation), to prepare an aqueous reducing agent containing solution as a reducing solution. After 10 minutes from the reaction initiation, the raw material solution (aqueous silver nitrate solution), the temperature was adjusted to 40° C., was added to the reducing solution (aqueous reducing agent containing solution) at a stroke to be allowed to react with the reducing solution, and stirred for 80 minutes. Thereafter, the temperature of the solution was raised at a temperature raising rate of 1° C./min from 40° C. to 60° C., and the stirring was stopped.

After the aggregates of the fine silver particles (silver nanoparticles) coated with sorbic acid were thus formed, a liquid containing the aggregates of the fine silver particles was filtered by a No. 5 filter paper, and then, substances recovered by filtration were washed with pure water to obtain the aggregates of the fine silver particles. The aggregates of the fine silver particles were dried at 80° C., for 12 hours in a vacuum dryer to obtain a dried powder of the aggregates of the fine silver particles. The dried powder of the aggregates of the fine silver particles thus obtained was broken to adjust the size of the secondary aggregates.

Furthermore, the average primary particle diameter of the fine silver particles was obtained by means of a scanning electron microscope (SEM). As a result, the average primary particle diameter was 100 nm.

Then, there were mixed 90.5 g (90.5% by weight) of the dried powder of the aggregates of the fine silver particles (coated with sorbic acid), the size of the secondary aggregates of which was thus adjusted, 8.05 g (8.05% by weight) of an octanediol (ODO) (2-ethyl-1,3-hexanediol produced by HK Neochem Co., Ltd., boiling point=244.2° C., viscosity=271 mPa·s at 20° C.) serving as a solvent, 0.95 g (0.95% by weight) of 2-butoxyethoxyacetic acid (BEA) (produced by Tokyo Chemical Industry Co., Ltd.) serving as a dispersant, and 0.5 g (0.5% by weight) of 3-methylbutane-1,2,3-triol (IPTL-A) (produced by Nippon Terpene Chemicals, Inc., boiling point=255.5° C., viscosity (20° C.)=9,155 mPa·s) serving as an addition agent. The mixture thus obtained was diluted with a mixed solvent (containing ethanol as a main solvent) (SOLMIX AP-7 produced by Japan Alcohol Treading Co., Ltd.) to be stirred. Then, the mixture was broken by a wet jet mill (RM-L1000 produced by Remix Corporation), and then, concentrated by volatilizing the mixed solvent (diluting solvent). Thereafter, the concentrated mixture was diluted with the octanediol (ODO) serving as the solvent to adjust the viscosity thereof to obtain a bonding material (silver paste) containing 89.2% by weight of silver. Furthermore, the content of silver in the bonding material was measured by the heating loss method.

The particle size of fine silver particles contained in the bonding material (silver paste) was evaluated by a grind gage (produced by BYK Limited, 50 μm stainless steel) as follows. First, the grind gage was cleaned with a mixed solvent (containing ethanol as a main solvent) (SOLMIX AP-7 produced by Japan Alcohol Treading Co., Ltd.), and sufficiently dried. Then, about 5 to 10 g of the silver paste was put on the side of a deeper groove of the grind gage (on the side of 50 μm), and a scraper was picked up by the thumb and another finger of both hands to be arranged so that the long sides of the scraper were parallel to the width directions of the grind gage while causing the blade edge of the scraper to contact the deep tip portion of the groove of the grind gage. Then, while the scraper was held so as to be perpendicular to the surface of the grind gage, the grind gage was drawn at a uniform velocity to a portion having a depth of zero in one or two seconds in a direction perpendicular to the long sides of the groove. Within 3 seconds after the drawing of the grind gage was completed, light was emitted so as to cause the pattern of the silver paste to be easily visible, and a portion, at which a remarkable line started to appear in the silver paste, was observed from a direction which was perpendicular to the long sides of the groove and which had an angle of 20 to 30° with respect to the surface of the grind gage. Thus, there were obtained the particle size of a line (the first scratch, maximum particle diameter Dmax) being the first to appear along the groove, and the particle size of a line (the fourth scratch) being the fourth to appear along the groove. Furthermore, there were ignored lines sparsely appearing before the remarkable line started to appear. Since there was one grind gage on each of right and left sides thereof, the average value of the values indicated by the two lines was obtained as the measured result. As a result, the first scratch was 10 μm or less, and the fourth scratch was 1 μm or less.

The viscosity of this bonding material (silver paste) was obtained by a rheometer (viscoelasticity measuring apparatus) (HAAKE Rheostress 600 produced by Thermo Scientific, Inc., used cone: C35/2°). As a result, the viscosity measured at 25° C., was 35 (Pa·s) at 5 rpm (15.7 $s^{-1}$), and the ratio (Ti value) of the viscosity at 1 rpm (3.1 $s^{-1}$) to the viscosity at 5 rpm (viscosity at 1 rpm/viscosity at 5 rpm) was 3.3 when the viscosity was measured at 25° C.

Then, a metal mask having a thickness of 150 μm was arranged on a substrate of copper (C1020) having a size of 30 mm×30 mm×1 mm, and the above-described bonding material (silver paste) was applied on the copper substrate so as to have a size of 11 mm×11 mm and a thickness (printing thickness) of 150 μm by printing using a metal squeegee.

Thereafter, the copper substrate having the bonding material applied thereon was arranged on a hot plate (produced by AS ONE Corporation) to be heated at 110° C., for 10 minutes in the atmosphere to be predried to remove bubbles and gas components in the bonding material to form a predried film. As the surface roughness of the predried film, the arithmetic average roughness Ra being a parameter indicating the surface roughness was obtained on the basis of JIS B0601 from the measured results using a later microscope (VK-9710 produced by KEYENCE CORPORATION). As a result, the arithmetic average roughness Ra was 1.1 μm. The predried film was observed by a digital microscope (VHX-900 produced by KEYENCE CORPORATION). As a result, no cracks were observed in the predried film.

After the copper substrate having the predried film formed thereon was cooled to 25° C., an Si chip (having a size of 10 mm×10 mm) plated with silver so as to form a silver plating film having a thickness of 0.3 mm was arranged on the predried film. Then, the substrate was arranged on a flip-chip bonder (produced by HISOL Inc.) to raise the temperature thereof to 250° C. in about 5 seconds while applying a load of 5 MPa in an atmosphere of nitrogen. After the temperature thereof reached to 250° C., the substrate is held for 5 minutes to burn the predried film to sinter silver in the silver paste to form a silver bonding layer to bond the Si chip to the copper substrate with the silver bonding layer to obtain a bonded product.

With respect to the bonded product thus obtained, the presence of voids in the silver bonding layer was observed by means of an ultrasonic microscope (C-SAM produced by SONOSCAN, INC.). As a result, no voids were observed. In order to evaluate the bonding strength of the bonded product, both ends of the copper substrate of the bonded product were caught by means of box wrenches to bend a portion having a size of 30 mm×30 mm of the copper substrate in the vicinity of the central portion thereof by about 90°, and thereafter, the copper substrate was returned to the original state. As a result, the percentage of the peeled portion of the Si chip on the copper substrate was less than 20%, so that the bonding strength was good.

Furthermore, the bonding material obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 μm, 70 μm, 100 μm and 200 μm, respectively. As a result, no cracks were observed in the predried film having the thickness of each of 50 μm, 70 μm and 100 μm, but cracks were observed in the predried film having the thickness of 200 μm.

Example 2

A bonding material (silver paste) containing 90.3% by weight of silver was obtained by the same method as that in Example 1, except that the amount of the dried powder of the aggregates of the fine silver particles (coated with sorbic acid) obtained by the same method as that in Example 1 was 91.5 g (91.5% by weight) and the amount of the solvent was 7.05 g (7.05% by weight).

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 72 (Pa·s) at 5 rpm (15.7 s$^{-1}$), and the Ti value was 3.3 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.2 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the percentage of the peeled portion of the Si chip on the copper substrate was less than 20%, so that the bonding strength was good.

Furthermore, the bonding material obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 μm, 70 μm, 100 μm and 200 μm, respectively. As a result, no cracks were observed in the predried film having the thickness of each of 50 μm, 70 μm and 100 μm, but cracks were observed in the predried film having the thickness of 200 μm.

Example 3

A bonding material (silver paste) containing 89.3% by weight of silver was obtained by the same method as that in Example 1, except that the amount of the solvent was 8.5 g (8.5% by weight) and the amount of the dispersant was 0.5 g (0.5% by weight) after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 36 (Pa·s) at 5 rpm (15.7 s$^{-1}$), and the Ti value was 3.3 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.5 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding material obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 μm, 70 μm, 100 μm and 200 μm, respectively. As a result, no cracks were observed in the predried film having the thickness of each of 50 μm, 70 μm and 100 μm, but cracks were observed in the predried film having the thickness of 200 μm.

Example 4

A bonding material (silver paste) containing 90.3% by weight of silver was obtained by the same method as that in Example 1, except that the amount of the dried powder of the aggregates of the fine silver particles (coated with sorbic acid) obtained by the same method as that in Example 1 was 91.5 g (91.5% by weight), the amount of the solvent was 7.5 g (7.5% by weight) and the amount of the dispersant was 0.5 g (0.5% by weight).

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C. was 71 (Pa·s) at 5 rpm (15.7 s$^{-1}$), and the Ti value was 3.5 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.5 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding material obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 μm, 70 μm, 100 μm and 200 μm, respectively. As a result, no cracks were observed in the predried film having the thickness of each of 50 µm, 70 µm and 100 µm, but cracks were observed in the predried film having the thickness of 200 µm.

Example 5

A bonding material (silver paste) containing 87.0% by weight of silver was obtained by the same method as that in Example 1, except that the amount of the dried powder of the aggregates of the fine silver particles (coated with sorbic acid) obtained by the same method as that in Example 1 was 86.0 g (86.0% by weight), the amount of the solvent was 13.25 g (13.25% by weight) and the amount of the dispersant was 0.25 g (0.25% by weight).

The particle size of fine silver particles contained in this bonding material (silver paste) was evaluated by the same method as that in Example 1. As a result, the first scratch was 10 µm or less, and the fourth scratch was 1 to 5 µm. The viscosity and Ti value of this bonding material (silver paste) were obtained by the same method as that in Example 1. As a result, the viscosity measured at 25° C., was 21 (Pa·s) at 5 rpm (15.7 s$^{-1}$), and the Ti value was 2.9 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.7 µm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding material obtained in this example was used for forming and observing a predried film by the same method as the above-described method, except that the bonding material having a thickness (printing thickness) of each of 50 µm, 70 µm, 100 µm and 200 µm was applied by means of a metal mask having a thickness of 50 µm, 70 µm, 100 µm and 200 µm, respectively. As a result, no cracks were observed in the predried film having the thickness of each of 50 µm, 70 µm and 100 µm, but cracks were observed in the predried film having the thickness of 200 µm.

Examples 6-8

Bonding materials (silver pastes) containing 86.9% by weight of silver (Examples 6 and 8) and 86.8% by weight of silver (Example 7), respectively, were obtained by the same method as that in Example 5, except that the amount of the solvent was 12.25 g (12.25% by weight) and the amount of the addition agent was 1.5 g (1.5% by weight) in Example 6, the amount of the solvent was 10.25 g (10.25% by weight) and the amount of the addition agent was 3.5 g (3.5% by weight) in Example 7, and the amount of the solvent was 8.75 (8.75% by weight) and the amount of the addition agent was 5.0 g (5.0% by weight) in Example 8, after the dried powder of the aggregates of the fine silver particles (coated with sorbic acid) was obtained by the same method as that in Example 1.

The particle size of fine silver particles contained in each of these bonding materials (silver pastes) was evaluated by the same method as that in Example 1. As a result, the first scratch was 10 µm or less, and the fourth scratch was 1 to 5 µm. The viscosity and Ti value of each of the bonding materials (silver pastes) were obtained by the same method as that in Example 1. As a result, the viscosity measured at 25° C., was 20 (Pa·s) (Example 6) and 21 (Pa·s) (Examples 7 and 8) at 5 rpm (15.7 s$^{-1}$), respectively, and the Ti value was 2.9 (Examples 6 and 7) and 2.8 (Example 8), respectively, when the viscosity was measured at 25° C.

These bonding material were used for forming predried films to obtain bonded products by the same method as that in Example 1, except that the bonding materials having a thickness of 200 µm were applied by means of a metal mask having a thickness of 200 µm. With respect to the surface roughness of each of the predried films, the arithmetic average roughness Ra was obtained by the same method as that in Example 1. As a result, the arithmetic average roughness Ra was 1.7 µm in Example 6, 1.6 µm in Example 7 and 1.8 µm in Example 8. Then, each of the predried films was observed by the same method as that in Example 1. As a result, no cracks were observed in each of the predried films. With respect to each of the bonded products, the presence of voids in the silver bonding layer was observed by the same method as that in Example 1. As a result, no voids were observed in the silver bonding layer of each of the bonded products. The bonding strength of each of the bonded products was evaluated by the same method as that in Example 1. As a result, the Si chip on the copper substrate of each of the bonded products completely remained, so that the bonding strength of each of the bonded products was very good.

Furthermore, the bonding materials obtained in these examples was used for forming and observing predried films by the same method as the above-described method, except that the bonding materials having a thickness (printing thickness) of each of 50 µm, 70 µm, 100 µm and 150 µm was applied by means of a metal mask having a thickness of 50 µm, 70 µm, 100 µm and 150 µm, respectively. As a result, no cracks were observed in each of the predried films.

Example 9

A bonding material (silver paste) containing 80.4% by weight of silver was obtained by the same method as that in Example 1, except that the amount of the dried powder of the aggregates of the fine silver particles (coated with sorbic acid) obtained by the same method as that in Example 1 was 86.0 g (86.0% by weight), the amount of the solvent was 13.5 g (13.5% by weight), and no dispersant was added.

The particle size of fine silver particles contained in this bonding material (silver paste) was evaluated by the same method as that in Example 1. As a result, the first scratch was 10 µm or less, and the fourth scratch was 1 to 5 µm. The viscosity and Ti value of this bonding material (silver paste) were obtained by the same method as that in Example 1. As a result, the viscosity measured at 25° C., was 22 (Pa·s) at 5 rpm (15.7 s$^{-1}$), and the Ti value was 3.6 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.7 µm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding material obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 μm, 70 μm, 100 μm and 200 μm, respectively. As a result, no cracks were observed in the predried film having the thickness of each of 50 μm, 70 μm and 100 μm, but cracks were observed in the predried film having the thickness of 200 μm.

Examples 10-12

Bonding materials (silver pastes) containing 80.2% by weight of silver (Examples 10 and 11) and 80.7% by weight of silver (Example 12), respectively, were obtained by the same method as that in Example 9, except that the amount of the solvent was 12.5 g (12.5% by weight) and the amount of the addition agent was 1.5 g (1.5% by weight) in Example 10, the amount of the solvent was 10.5 g (10.5% by weight) and the amount of the addition agent was 3.5 g (3.5% by weight) in Example 11, and the amount of the solvent was 9.0 (9.0% by weight) and the amount of the addition agent was 5.0 g (5.0% by weight) in Example 12, after the dried powder of the aggregates of the fine silver particles (coated with sorbic acid) was obtained by the same method as that in Example 1.

The particle size of fine silver particles contained in each of these bonding materials (silver pastes) was evaluated by the same method as that in Example 1. As a result, the first scratch was 10 μm or less, and the fourth scratch was 1 to 5 μm. The viscosity and Ti value of each of these bonding materials (silver pastes) were obtained by the same method as that in Example 1. As a result, the viscosity measured at 25° C., was 21 (Pa·s) (Examples 10 and 11) and 24 (Pa·s) (Example 12) at 5 rpm (15.7 s$^{-1}$), respectively, and the Ti value was 3.6 (Example 10), 3.6 (Example 11) and 3.4 (Example 12), respectively, when the viscosity was measured at 25° C.

These bonding material were used for forming predried films to obtain bonded products by the same method as that in Example 6. With respect to the surface roughness of each of these predried films, the arithmetic average roughness Ra was obtained by the same method as that in Example 1. As a result, the arithmetic average roughness Ra was 1.8 μm with respect to each of the predried films. Then, each of the predried films was observed by the same method as that in Example 1. As a result, no cracks were observed in each of the predried films. With respect to each of the bonded products, the presence of voids in the silver bonding layer was observed by the same method as that in Example 1. As a result, no voids were observed in the silver bonding layer of each of the bonded products. The bonding strength of each of the bonded products was evaluated by the same method as that in Example 1. As a result, the Si chip on the copper substrate of each of the bonded products completely remained, so that the bonding strength of each of the bonded products was very good.

Furthermore, the bonding materials obtained in these examples was used for forming and observing predried films by the same method as the above-described method, except that the bonding materials having a thickness (printing thickness) of each of 50 μm, 70 μm, 100 μm and 150 μm was applied by means of a metal mask having a thickness of 50 μm, 70 μm, 100 μm and 150 μm, respectively. As a result, no cracks were observed in each of the predried films.

Example 13

A bonding material (silver paste) containing 78.1% by weight of silver was obtained by the same method as that in Example 12, except that 3-methyl-1,3-butanediol (Terusolve IPG produced by Nippon Terpene Chemicals, Inc., boiling point=203° C., viscosity=250 mPa·s at 20° C.) was substituted for the octanediol (ODO) serving as a solvent, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 to 5 μm. The viscosity and Ti value of this bonding material (silver paste) were obtained by the same method as that in Example 1. As a result, the viscosity measured at 25° C., was 24 (Pa·s) at 5 rpm (15.7 s$^{-1}$), and the Ti value was 3.0 when the viscosity was measured at 25° C.

This bonding material was used for forming a predried film to obtain a bonded product by the same method as that in Example 6. With respect to the surface roughness of this predried film, the arithmetic average roughness Ra was obtained by the same method as that in Example 1. As a result, the arithmetic average roughness Ra was 1.8 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding materials obtained in this example was used for forming and observing a predried film by the same method as the above-described method, except that the bonding materials having a thickness (printing thickness) of each of 50 μm, 70 μm, 100 μm and 150 μm was applied by means of a metal mask having a thickness of 50 μm, 70 μm, 100 μm and 150 μm, respectively. As a result, no cracks were observed in each of the predried films.

Example 14

A bonding material (silver paste) containing 88.9% by weight of silver was obtained by the same method as that in Example 1, except that 2-methylbutane-1,2,4-triol (IPTL-B) (produced by Nippon Terpene Chemicals, Inc., boiling point=278-282° C., viscosity=5,500 mPa·s (at 20° C.)) was substituted for 3-methylbutane-1,2,3-triol (IPTL-A) serving as an addition agent, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 24 (Pa·s) at 5 rpm (15.7 s$^{-1}$), and the Ti value was 2.9 when the viscosity was measured at 25° C.

This bonding material was used for forming a predried film to obtain a bonded product by the same method as that in Example 1. With respect to the surface roughness of this predried film, the arithmetic average roughness Ra was obtained by the same method as that in Example 1. As a result, the arithmetic average roughness Ra was 1.7 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding materials obtained in this example was used for forming and observing a predried film by the same method as the above-described method, except that the bonding material having a thickness (printing thickness) of each of 50 μm, 70 μm, 100 μm and 200 μm was applied by means of a metal mask having a thickness of 50 m, 70 μm, 100 μm and 200 μm, respectively. As a result, no cracks were observed in the predried film having the thickness of each of 50 μm, 70 m and 100 μm, but cracks were observed in the predried film having the thickness of 200 μm.

Example 15

A bonding material (silver paste) containing 82.7% by weight of silver was obtained by the same method as that in Example 12, except that 2-methylbutane-1,2,4-triol (IPTL-B) (produced by Nippon Terpene Chemicals, Inc., boiling point=278-282° C., viscosity=5,500 mPa·s (at 20° C.)) was substituted for 3 methylbutane-1,2,3-triol (IPTL-A) serving as an addition agent, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 23 (Pa·s) at 5 rpm (15.7 s$^{-1}$), and the Ti value was 2.8 when the viscosity was measured at 25° C.

This bonding material was used for forming a predried film to obtain a bonded product by the same method as that in Example 6. With respect to the surface roughness of this predried film, the arithmetic average roughness Ra was obtained by the same method as that in Example 1. As a result, the arithmetic average roughness Ra was 1.7 μm. Then, the predried film was observed by the same method as that in Example 1. As a result, no cracks were observed in the predried film. With respect to the bonded product, the presence of voids in the silver bonding layer was observed by the same method as that in Example 1. As a result, no voids were observed. The bonding strength of the bonded product was evaluated by the same method as that in Example 1. As a result, the Si chip on the copper substrate completely remained, so that the bonding strength of the bonded product was very good.

Furthermore, the bonding materials obtained in this example was used for forming and observing a predried film by the same method as the above-described method, except that the bonding materials having a thickness (printing thickness) of each of 50 μm, 70 μm, 100 μm and 150 μm was applied by means of a metal mask having a thickness of 50 μm, 70 μm, 100 μm and 150 μm, respectively. As a result, no cracks were observed in each of the predried films.

Comparative Example 1

A bonding material (silver paste) containing 89.3% by weight of silver was obtained by the same method as that in Example 1, except that the amount of the solvent was 8.55 g (8.55% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 36 (Pa·s) at 5 rpm (15.7 s$^{-1}$), and the Ti value was 3.3 when the viscosity was measured at 25° C.

This bonding material was used for forming and observing a predried film by the same method as that in Example 1. As a result, cracks were observed in the predried film, so that any bonded product was not produced.

Comparative Example 2

A bonding material (silver paste) containing 90.3% by weight of silver was obtained by the same method as that in Example 2, except that the amount of the solvent was 7.55 g (7.55% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 73 (Pa·s) at 5 rpm (15.7 s$^{-1}$), and the Ti value was 3.5 when the viscosity was measured at 25° C.

This bonding material was used for forming and observing a predried film by the same method as that in Example 1. As a result, cracks were observed in the predried film, so that any bonded product was not produced.

Comparative Example 3

A bonding material (silver paste) containing 89.3% by weight of silver was obtained by the same method as that in Example 3, except that the amount of the solvent was 9.0 g (9.0% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C. was 37 (Pa·s) at 5 rpm (15.7 s$^{-1}$), and the Ti value was 3.3 when the viscosity was measured at 25° C.

This bonding material was used for forming and observing a predried film by the same method as that in Example 1. As a result, cracks were observed in the predried film, so that any bonded product was not produced.

Comparative Example 4

A bonding material (silver paste) containing 90.3% by weight of silver was obtained by the same method as that in Example 4, except that the amount of the solvent was 8.0 g (8.0% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 μm or less. The viscosity and Ti value of this bonding material (silver paste) were obtained by the same method as that in Example 1. As a result, the viscosity measured at 25° C., was 75 (Pa·s) at 5 rpm (15.7 s$^{-1}$), and the Ti value was 3.5 when the viscosity was measured at 25° C.

This bonding material was used for forming and observing a predried film by the same method as that in Example 1. As a result, cracks were observed in the predried film, so that any bonded product was not produced.

Comparative Example 5

A bonding material (silver paste) containing 89.3% by weight of silver was obtained by the same method as that in Example 1, except that the amount of the solvent was 9.15 g (9.15% by weight), the amount of the dispersant was 0.35 g (0.35% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 20 μm, and the fourth scratch was 10 μm. The viscosity and Ti value of this bonding material (silver paste) were obtained by the same method as that in Example 1. As a result, the viscosity measured at 25° C., was 53 (Pa·s) at 5 rpm (15.7 s$^{-1}$), and the Ti value was 3.5 when the viscosity was measured at 25° C.

This bonding material was used for forming and observing a predried film by the same method as that in Example 1. As a result, cracks were observed in the predried film, so that any bonded product was not produced.

Comparative Example 6

A bonding material (silver paste) containing 89.3% by weight of silver was obtained by the same method as that in Example 1, except that the amount of the solvent was 9.25 g (9.25% by weight), the amount of the dispersant was 0.25 g (0.25% by weight) and no addition agent was added, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 20 μm, and the fourth scratch was 13 μm. The viscosity and Ti value of this bonding material (silver paste) were obtained by the same method as that in Example 1. As a result, the viscosity measured at 25° C., was 63 (Pa·s) at 5 rpm (15.7 s$^{-1}$), and the Ti value was 3.6 when the viscosity was measured at 25° C.

This bonding material was used for forming and observing a predried film by the same method as that in Example 1. As a result, cracks were observed in the predried film, so that any bonded product was not produced.

Comparative Example 7

A bonding material (silver paste) containing 82.8% by weight of silver was obtained by the same method as that in Example 10, except that 1,2,6-hexanetriol (produced by Tokyo Chemical Industry Co., Ltd., boiling point=178° C., viscosity=2,630 mPa·s (at 20° C.)) was substituted for 3 methylbutane-1,2,3-triol (IPTL-A) serving as an addition agent, after the dried powder of the aggregates of the fine silver particles (coated with sorbic acid) was obtained by the same method as that in Example 1.

The particle size of fine silver particles contained in this bonding material (silver paste) was evaluated by the same method as that in Example 1. As a result, the first scratch was 10 μm or less, and the fourth scratch was 1 to 5 μm. The viscosity and Ti value of this bonding material (silver paste) were obtained by the same method as that in Example 1. As a result, the viscosity measured at 25° C., was 23 (Pa·s) at 5 rpm (15.7 s$^{-1}$), and the Ti value was 3.3 when the viscosity was measured at 25° C.

This bonding material was used for forming and observing a predried film by the same method as that in Example 1. As a result, cracks were observed in the predried film, so that any bonded product was not produced.

The producing conditions and characteristics of the bonding materials produced in these examples and comparative examples are shown in Tables 1-4. In Table 3, "○" is shown if no cracks were observed in the predried film, and "x" is shown if cracks were observed. In Table 4, "⊚" is shown if the Si chip on the copper substrate completely remained (bonding area=100%), so that the bonding strength of the bonded product was very good, and "○" is shown if the percentage of the peeled portion of the Si chip on the copper substrate was less than 20% (bonding area >80%), so that the bonding strength of the bonded product was good.

TABLE 1

|  | Fine Silver Particles (wt %) | Solvent (wt %) | Dispersant (wt %) | Addition Agent (wt %) |
|---|---|---|---|---|
| Ex. 1 | 90.5 | ODO 8.05 | 0.95 | IPTL-A 0.5 |
| Ex. 2 | 91.5 | ODO 7.05 | 0.95 | IPTL-A 0.5 |
| Ex. 3 | 90.5 | ODO 8.5 | 0.5 | IPTL-A 0.5 |
| Ex. 4 | 91.5 | ODO 7.5 | 0.5 | IPTL-A 0.5 |
| Ex. 5 | 86.0 | ODO 13.25 | 0.25 | IPTL-A 0.5 |
| Ex. 6 | 86.0 | ODO 12.25 | 0.25 | IPTL-A 1.5 |

TABLE 1-continued

|  | Fine Silver Particles (wt %) | Solvent (wt %) | Dispersant (wt %) | Addition Agent (wt %) |
|---|---|---|---|---|
| Ex. 7 | 86.0 | ODO 10.25 | 0.25 | IPTL-A 3.5 |
| Ex. 8 | 86.0 | ODO 8.75 | 0.25 | IPTL-A 5.0 |
| Ex. 9 | 86.0 | ODO 13.5 | 0 | IPTL-A 0.5 |
| Ex. 10 | 86.0 | ODO 12.5 | 0 | IPTL-A 1.5 |
| Ex. 11 | 86.0 | ODO 10.5 | 0 | IPTL-A 3.5 |
| Ex. 12 | 86.0 | ODO 9.0 | 0 | IPTL-A 5.0 |
| Ex. 13 | 86.0 | Terusolve IPG 9.0 | 0 | IPTL-A 5.0 |
| Ex. 14 | 90.5 | ODO 8.05 | 0.95 | IPTL-B 0.5 |
| Ex. 15 | 86.0 | ODO 9.0 | 0 | IPTL-B 5.0 |
| Comp. 1 | 90.5 | ODO 8.55 | 0.95 | — |
| Comp. 2 | 91.5 | ODO 7.55 | 0.95 | — |
| Comp. 3 | 90.5 | ODO 9.0 | 0.5 | — |
| Comp. 4 | 91.5 | ODO 8.0 | 0.5 | — |
| Comp. 5 | 90.5 | ODO 9.15 | 0.35 | — |
| Comp. 6 | 90.5 | ODO 9.25 | 0.25 | — |
| Comp. 7 | 86.0 | ODO 12.5 | 0 | 1,2,6-hexanetriol 1.5 |

TABLE 2

|  | Concentration of Ag (wt %) | Particle Size (μm) 1st | Particle Size (μm) 4th | Viscosity (Pa·s) | Ti |
|---|---|---|---|---|---|
| Ex. 1 | 89.2 | <10 | <1 | 35 | 3.3 |
| Ex. 2 | 90.3 | <10 | <1 | 72 | 3.3 |
| Ex. 3 | 89.3 | <10 | <1 | 36 | 3.3 |
| Ex. 4 | 90.3 | <10 | <1 | 71 | 3.5 |
| Ex. 5 | 87.0 | <10 | <1~5 | 21 | 2.9 |
| Ex. 6 | 86.9 | <10 | <1~5 | 20 | 2.9 |
| Ex. 7 | 86.8 | <10 | <1~5 | 21 | 2.9 |
| Ex. 8 | 86.9 | <10 | <1~5 | 21 | 2.8 |
| Ex. 9 | 80.4 | <10 | <1~5 | 22 | 3.6 |
| Ex. 10 | 80.2 | <10 | <1~5 | 21 | 3.6 |
| Ex. 11 | 80.2 | <10 | <1~5 | 21 | 3.6 |
| Ex. 12 | 80.7 | <10 | <1~5 | 24 | 3.4 |
| Ex. 13 | 78.1 | <10 | <1~5 | 24 | 3.0 |
| Ex. 14 | 88.9 | <10 | <1 | 24 | 2.9 |
| Ex. 15 | 82.7 | <10 | <1~5 | 23 | 2.8 |
| Comp. 1 | 89.3 | <10 | <1 | 36 | 3.3 |
| Comp. 2 | 90.3 | <10 | <1 | 73 | 3.5 |
| Comp. 3 | 89.3 | <10 | <1 | 37 | 3.3 |
| Comp. 4 | 90.3 | <10 | <1 | 75 | 3.5 |
| Comp. 5 | 89.3 | 20 | 10 | 53 | 3.5 |
| Comp. 6 | 89.3 | 20 | 13 | 63 | 3.6 |
| Comp. 7 | 82.8 | <10 | <1~5 | 23 | 3.3 |

TABLE 3

|  | Printing Thickness (μm) 50 | 70 | 100 | 150 | 200 |
|---|---|---|---|---|---|
| Ex. 1 | ○ | ○ | ○ | ○ | X |
| Ex. 2 | ○ | ○ | ○ | ○ | X |
| Ex. 3 | ○ | ○ | ○ | ○ | X |
| Ex. 4 | ○ | ○ | ○ | ○ | X |
| Ex. 5 | ○ | ○ | ○ | ○ | X |
| Ex. 6 | ○ | ○ | ○ | ○ | ○ |
| Ex. 7 | ○ | ○ | ○ | ○ | ○ |
| Ex. 8 | ○ | ○ | ○ | ○ | ○ |
| Ex. 9 | ○ | ○ | ○ | ○ | X |
| Ex. 10 | ○ | ○ | ○ | ○ | ○ |
| Ex. 11 | ○ | ○ | ○ | ○ | ○ |
| Ex. 12 | ○ | ○ | ○ | ○ | ○ |
| Ex. 13 | ○ | ○ | ○ | ○ | ○ |
| Ex. 14 | ○ | ○ | ○ | ○ | X |
| Ex. 15 | ○ | ○ | ○ | ○ | ○ |
| Comp. 1 | ○ | ○ | X | X | X |
| Comp. 2 | ○ | ○ | X | X | X |
| Comp. 3 | ○ | ○ | X | X | X |
| Comp. 4 | ○ | ○ | X | X | X |
| Comp. 5 | ○ | ○ | X | X | X |
| Comp. 6 | ○ | ○ | X | X | X |
| Comp. 7 | ○ | ○ | ○ | X | X |

TABLE 4

|  | Predried Film Ra (μm) | Printing Thickness (μm) | Bonding (Bending Test) |
|---|---|---|---|
| Ex. 1 | 1.1 | 150 | ○ |
| Ex. 2 | 1.2 | 150 | ○ |
| Ex. 3 | 1.5 | 150 | ⊚ |
| Ex. 4 | 1.5 | 150 | ⊚ |
| Ex. 5 | 1.7 | 150 | ⊚ |
| Ex. 6 | 1.7 | 200 | ⊚ |
| Ex. 7 | 1.6 | 200 | ⊚ |
| Ex. 8 | 1.8 | 200 | ⊚ |
| Ex. 9 | 1.7 | 150 | ⊚ |
| Ex. 10 | 1.8 | 200 | ⊚ |
| Ex. 11 | 1.8 | 200 | ⊚ |
| Ex. 12 | 1.8 | 200 | ⊚ |
| Ex. 13 | 1.8 | 200 | ⊚ |
| Ex. 14 | 1.7 | 150 | ○ |
| Ex. 15 | 1.7 | 200 | ⊚ |

The invention claimed is:

1. A bonding material of a silver paste consisting of:
   70 to 95% by weight of fine silver particles having an average primary particle diameter of 1 to 200 nm, the fine silver particles being coated with an organic compound having a carbon number of not greater than 8;
   0.1 to 10% by weight of a triol which is 3-methylbutane-1,2,3-triol or 2-methylbutane-1,2,4-triol; and
   the balance of a diol.

2. A bonding material as set forth in claim 1, wherein said triol has a boiling point of 200 to 300° C.

3. A bonding material as set forth in claim 1, wherein said triol has a viscosity of 2,000 to 10,000 mPa·s at 20° C.

4. A bonding material as set forth in claim 1, wherein said diol is an octanediol.

5. A bonding material consisting of:
   70 to 95% by weight of fine silver particles having an average primary particle diameter of 1 to 200 nm, the fine silver particles being coated with an organic compound having a carbon number of not greater than 8;
   0.1 to 10% by weight of a triol which is 3-methylbutane-1,2,3-triol or 2-methylbutane-1,2,4-triol;
   1.0% by weight or less of a dispersant; and
   the balance of a diol.

6. A bonding material as set forth in claim 5, wherein said dispersant is 2-butoxyethoxyacetic acid.

7. A bonding material as set forth in claim 1, wherein said organic compound is sorbic acid.

8. A bonding method comprising the steps of:
   arranging a bonding material, as set forth in claim 1, between articles; and
   heating the bonding material to sinter silver therein to form a silver bonding layer to bond said articles to each other with the silver bonding layer.

9. A bonding material as set forth in claim 1, wherein the content of said fine silver particles is 75 to 93% by weight.

10. A bonding material as set forth in claim 5, wherein said triol has a boiling point of 200 to 300° C.

11. A bonding material as set forth in claim 5, wherein said triol has a viscosity of 2,000 to 10,000 mPa·s at 20° C.

12. A bonding material as set forth in claim 5, wherein said diol is an octanediol.

13. A bonding material as set forth in claim 5, wherein said organic compound is sorbic acid.

14. A bonding material as set forth in claim 5, wherein the content of said fine silver particles is 75 to 93% by weight.

15. A bonding material of a silver paste consisting of:
a diol;
a triol which is 3-methylbutane-1,2,3-triol or 2-methylbutane-1,2,4-triol; and
fine silver particles having an average primary particle diameter of 1 to 200 nm, the fine silver particles being coated with an organic compound having a carbon number of not greater than 8.

16. A bonding material of a silver paste consisting of:
a diol;
a triol which is 3-methylbutane-1,2,3-triol or 2-methylbutane-1,2,4-triol;
a dispersant; and
fine silver particles having an average primary particle diameter of 1 to 200 nm, the fine silver particles being coated with an organic compound having a carbon number of not greater than 8.

17. A bonding material as set forth in claim 15, wherein said diol is an octanediol.

18. A bonding material as set forth in claim 15, wherein said dispersant is 2-butoxyethoxyacetic acid.

19. A bonding material as set forth in claim 16, wherein said diol is an octanediol.

20. A bonding material as set forth in claim 16, wherein said dispersant is 2-butoxyethoxyacetic acid.

* * * * *